(12) United States Patent
Zhuang et al.

(10) Patent No.: US 10,943,928 B2
(45) Date of Patent: Mar. 9, 2021

(54) DISPLAY SUBSTRATE, METHOD FOR MANUFACTURING THE SAME AND DISPLAY DEVICE

(71) Applicants: BOE Technology Group Co., Ltd., Beijing (CN); Fuzhou BOE Optoelectronics Technology Co., Ltd., Fujian (CN)

(72) Inventors: Zihua Zhuang, Beijing (CN); Xi Chen, Beijing (CN); Jiamin Liao, Beijing (CN); Zhendian Wu, Beijing (CN); Dahai Li, Beijing (CN); Linlin Lin, Beijing (CN); Gaopan Tang, Beijing (CN); Guichun Hong, Beijing (CN); Jin Wang, Beijing (CN); Xinmao Qiu, Beijing (CN); Changhong Shi, Beijing (CN); Yaochao Lv, Beijing (CN); Jiarong Liu, Beijing (CN); Zongxiang Li, Beijing (CN); Hongtao Lin, Beijing (CN)

(73) Assignees: BOE TECHNOLOGY GROUP CO., LTD., Beijing (CN); FUZHOU BOE OPTOELECTRONICS TECHNOLOGY CO., LTD., Fujian (CN)

( * ) Notice: Subject to any disclaimer, the term of this patent is extended or adjusted under 35 U.S.C. 154(b) by 83 days.

(21) Appl. No.: 16/211,870

(22) Filed: Dec. 6, 2018

(65) Prior Publication Data
US 2019/0296049 A1    Sep. 26, 2019

(30) Foreign Application Priority Data
Mar. 26, 2018  (CN) .......................... 201810251783.9

(51) Int. Cl.
H01L 27/12    (2006.01)
H01L 29/66    (2006.01)
H01L 29/786   (2006.01)

(52) U.S. Cl.
CPC .......... *H01L 27/124* (2013.01); *H01L 27/127* (2013.01); *H01L 27/1285* (2013.01); *H01L 29/66765* (2013.01); *H01L 29/78669* (2013.01)

(58) Field of Classification Search
CPC ......... H01L 29/78669; H01L 29/66765; H01L 27/1285
See application file for complete search history.

(56) References Cited

U.S. PATENT DOCUMENTS

2013/0260509 A1* 10/2013 Kimura ............. H01L 29/66969
                                                         438/104

FOREIGN PATENT DOCUMENTS

CN    101826534 A    9/2010
CN    203367291 U    12/2013
(Continued)

OTHER PUBLICATIONS

First Office Action dated Mar. 5, 2020 corresponding to Chinese application No. 201810251783.9.

*Primary Examiner* — Amar Movva
(74) *Attorney, Agent, or Firm* — Nath, Goldberg & Meyer; Joshua B. Goldberg

(57) ABSTRACT

A display substrate, a method for manufacturing the same and a display device are provided. The method includes steps of forming a common electrode line, a semiconductor pattern, and a data line on a base substrate, so that the semiconductor pattern is located between the common electrode line and the data line; and irradiating the semiconductor pattern by using light in a predetermined wavelength range from a side of the base substrate distal to the semi- (Continued)

101 — Forming a common electrode line, a semiconductor pattern, and a data line on a base substrate, so that the semiconductor pattern is located between the common electrode line and the data line 102 — Irradiating the semiconductor pattern by using light in a predetermined wavelength range from a side of the base substrate distal to the semiconductor pattern, to generate a dangling-bond defect state in a band gap of the semiconductor pattern conductor pattern, to generate a dangling-bond defect state in a band gap of the semiconductor pattern.

17 Claims, 5 Drawing Sheets

(56) References Cited

FOREIGN PATENT DOCUMENTS

| CN | 205507319 U | 8/2016 |
|----|-------------|--------|
| CN | 106158581 A | 11/2016 |

* cited by examiner

DISPLAY SUBSTRATE, METHOD FOR MANUFACTURING THE SAME AND DISPLAY DEVICE

CROSS-REFERENCE TO RELATED APPLICATIONS

The present application claims the priority of Chinese Patent Application No. 201810251783.9, filed on Mar. 26, 2018, the contents of which are incorporated herein in their entirety by reference.

TECHNICAL FIELD

The present disclosure relates to the field of display technology, and in particular, relates to a display substrate, a method for manufacturing the same, and a display device.

BACKGROUND

With the development of display technology, the application field of liquid crystal display devices has become wider and wider. A coupling capacitance may be formed between a data line and a common electrode line in each of the liquid crystal display devices. In a case where such a coupling capacitance is formed, when a data voltage on the data line changes, a common voltage on the common electrode line is distorted due to the coupling effect, and thus deviates from the normal potential or the desired potential.

SUMMARY

Embodiments of the present disclosure provide a display substrate, a method for manufacturing the same, and a display device.

Some embodiments of the present disclosure provide a method for manufacturing a display substrate, including steps of forming a common electrode line, a semiconductor patter, and a data line on a base substrate, so that the semiconductor pattern is located between the common electrode line and the data line; and irradiating the semiconductor pattern by using light in a predetermined wavelength range from a side of the base substrate distal to the semiconductor pattern, to generate a dangling-bond defect state in a band gap of the semiconductor pattern.

In an embodiment, the light in a predetermined wavelength range is ultraviolet light; and the step of irradiating the semiconductor pattern by using light in a predetermined wavelength range includes a step of irradiating the semiconductor pattern by using ultraviolet light with a predetermined exposure dose.

In an embodiment, the predetermined exposure dose ranges from 3,000 millijoules to 10,000 millijoules.

In an embodiment, the predetermined exposure dose ranges from 5,000 millijoules to 7,000 millijoules.

In an embodiment, the step of forming a common electrode line, a semiconductor pattern, and a data line on a base substrate includes steps of forming a gate line on the base substrate;

forming a gate insulation layer on the gate line; and forming the semiconductor pattern and the data line on the gate insulation layer sequentially.

In an embodiment, the step of forming a gate line on the base substrate includes forming a common electrode and a gate, so that the gate line and the gate are located in a same layer, and the common electrode and the common electrode line are located in a same layer; and the step of forming the semiconductor pattern and the data line on the gate insulation layer sequentially includes forming an active layer pattern, a source and a drain, so that the semiconductor pattern and the active layer pattern are located in a same layer, the source, the drain and the data line are located in a same layer, and the data line and the semiconductor pattern are arranged adjacent to each other.

In an embodiment, prior to the step of irradiating the semiconductor pattern by using light in a predetermined wavelength range from a side of the base substrate distal to the semiconductor patter, the method further includes steps of forming a passivation layer above the base substrate, so that the passivation layer completely covers an upper surface of the base substrate;

forming a via in the passivation layer and forming a pixel electrode on the passivation layer, so that the pixel electrode is connected to the drain through the via.

In an embodiment, after the step of irradiating the semiconductor patter by using light in a predetermined wavelength range from a side of the base substrate distal to the semiconductor patter, the method further includes steps of forming a passivation layer above the base substrate, so that the passivation layer completely covers an upper surface of the base substrate;

forming a via in the passivation layer; and forming a pixel electrode on the passivation layer, so that the pixel electrode is connected to the drain through the via.

In an embodiment, the semiconductor patter is made of hydrogenated amorphous silicon.

In an embodiment, there is an overlapping region between the data line and the common electrode line in a direction perpendicular to the base substrate, and at the overlapping region, the semiconductor patter is formed between the common electrode line and the data line.

Some embodiments of the present disclosure provide a display substrate, wherein the display substrate is manufactured by the method according to any one of the embodiments of the present disclosure.

Some embodiments of the present disclosure provide a display device, which includes the display substrate according to the embodiment of the present disclosure.

In an embodiment, the display device includes a liquid crystal display device or an OLED display device.

DETAILED DESCRIPTION

To make one of ordinary skill in the art better understand the technical solutions of the present disclosure, a display substrate, a method for manufacturing the same and a display device provided by the present disclosure will be described in detail below with reference to the accompanying drawings.

The inventors of the present disclosure have found that in the related art, in a case where a display substrate of a liquid crystal display device is made by a 4-mask process (which includes four photolithography process), a semiconductor patter (e.g., the semiconductor pattern is provided in a layer where an active layer is located) exists under a data line. The data line and the common electrode line are arranged close to each other such that a coupling capacitance is formed between. The coupling capacitance will cause a common voltage to be distorted, thereby resulting in a coupled oscillation.

Figure 1:
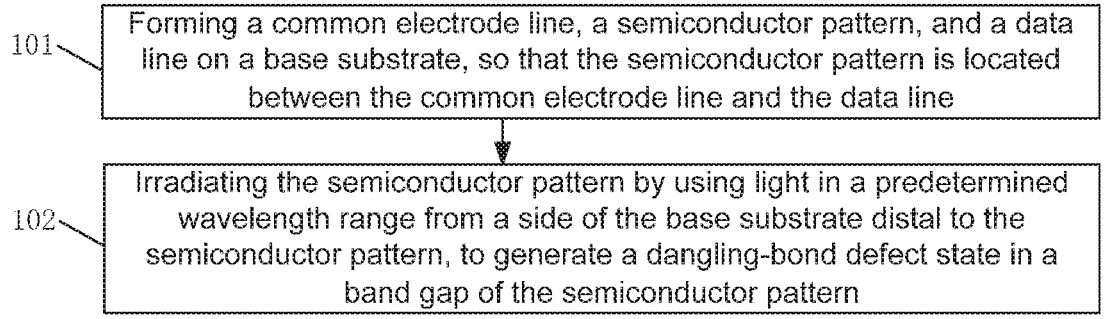
FIG. 1 is a schematic flowchart showing a method for manufacturing a display substrate according to an embodiment of the present disclosure.
Figure 6:
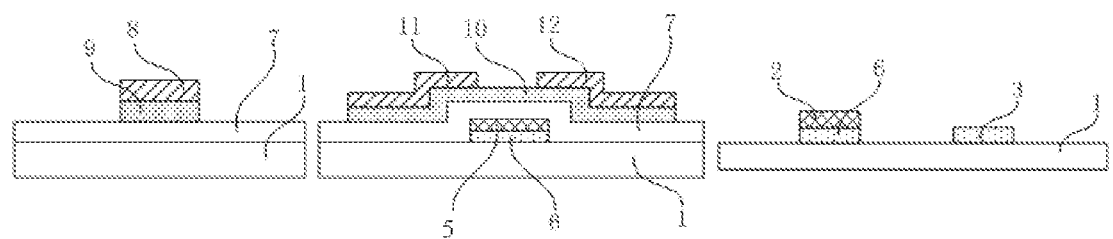
FIG. 6 is a schematic diagram showing the combination of FIGS. 3b, 3d and 3e.

FIG. 1 is a schematic flowchart showing a method for manufacturing a display substrate according to an embodiment of the present disclosure. Referring to FIGS. 1, 3c and 6, the method may include the following steps 101 and 102.

Figure 3C:
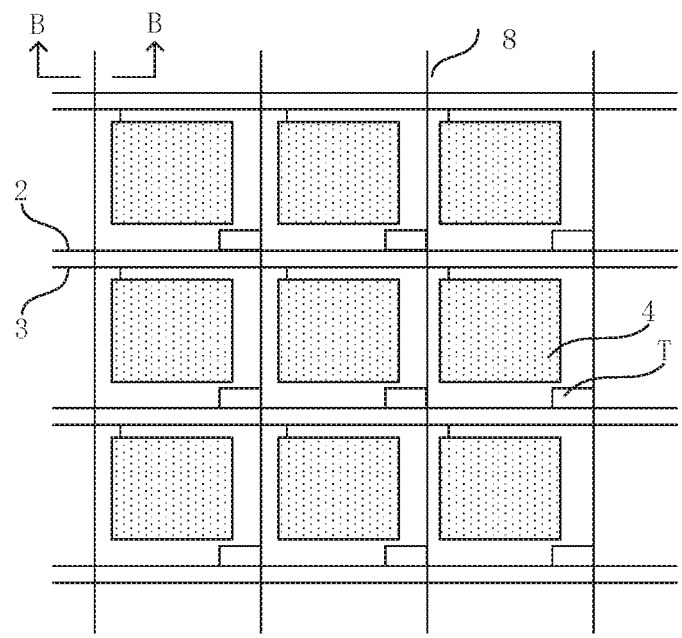
FIG. 3c is a schematic diagram showing a display substrate manufactured by a method according to an embodiment of the present disclosure.
Figure 3D:
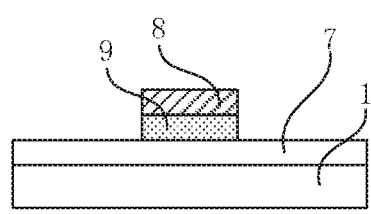
FIG. 3d is a schematic cross-sectional view of the display substrate shown in FIG. 3c taken along the line B-B therein.
Figure 4:
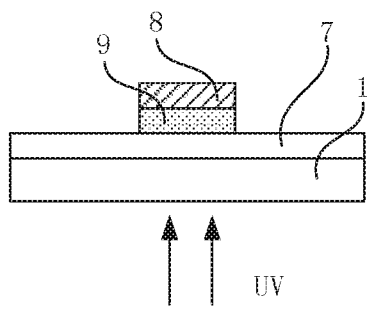
FIG. 4 is a schematic diagram showing an ultraviolet light irradiation step of a method for manufacturing a display substrate according to an embodiment of the present disclosure.

Step 101 includes forming a common electrode line 3, a semiconductor pattern 9, and a data line 8 on a base substrate 1, so that the semiconductor pattern 9 is located between the common electrode line 3 and the data line 8 (e.g., in a stacking direction thereof). In an embodiment, there is usually an overlapping region between the data line 8 and the common electrode line 3 in the stacking direction to form an overlapping capacitor, and at the overlapping region, the semiconductor pattern 9 may be formed between the common electrode line 3 and the data line 8 to serve as a dielectric layer in the overlapping capacitor. It should be noted that, the term "adjacent to each other" may be used herein to mean that two elements are adjacent to each other so that a coupling capacitance is formed therebetween. If a distance between the two elements is so far that the coupling capacitance generated therebetween is negligible, the two elements may be considered not to be adjacent to each other. As shown in FIGS. 3c and 6, a plurality of gate lines 2 and a plurality of data lines 8 formed on the base substrate 1 cross each other to define a plurality of pixels arranged in a plurality of rows and a plurality of columns. A thin film transistor (TFT) T is provided at a corner of each of the pixels, and the thin film transistors T in a same column may correspond to one data line 8. The base substrate 1 is provided with the semiconductor patter 9 thereon, and the semiconductor patter 9 may be provided in a layer where active layer patterns 10 of the corresponding thin film transistors T (e.g., the thin film transistors T in a same column) are located. Each data line 8 may be provided in a layer where both sources 11 and drains 12 of the corresponding thin film transistors T (e.g., the thin film transistors T in a same column) are located. Each gate line 2 may be provided in a layer where the gates 5 of the corresponding thin film transistors T (e.g., the thin film transistor T in a same row). FIGS. 3d and 4 schematically illustrate the arrangement of the data line 8 and the semiconductor pattern 9. It should be understood that the data line 8 and the semiconductor pattern 9 may not be in contact with each other, and are not necessarily completely aligned with each other in the vertical direction (i.e., the stacking direction), as long as the semiconductor pattern 9 is located between the common electrode line 3 and the data line 8 in the stacking direction.

Step 102 includes irradiating the semiconductor pattern 9 by using light of a predetermined wavelength from a side of the base substrate 1 distal to the semiconductor pattern 9, to generate a dangling-bond defect state in a band gap of the semiconductor pattern 9, as shown in FIG. 4. It should be noted that, the dangling-bond defect state may also be referred to as a dangling-bond defect, which means that a dangling bond is a defect (e.g., a crystallographic defect) or a defect state.

In an embodiment, the light in the predetermined wavelength range is ultraviolet light having a wavelength from about 10 nm to 400 nm.

In the method for manufacturing a display substrate according to the present embodiment, the gate line 2, the semiconductor pattern 9 and the data line 8 are formed on the base substrate 1, so that the semiconductor pattern 9 and the data line 8 are arranged adjacent to each other. Further, the semiconductor pattern 9 is irradiated by using the light in the predetermined wavelength range from the side of the base substrate 1 distal to the semiconductor pattern 9, to generate a dangling-bond defect state in a band gap of the semiconductor pattern 9. Thus, an amplitude and a recovery time of a distortion of a common voltage on the common electrode line are reduced, thereby eliminating the coupled oscillation.

Figure 2:
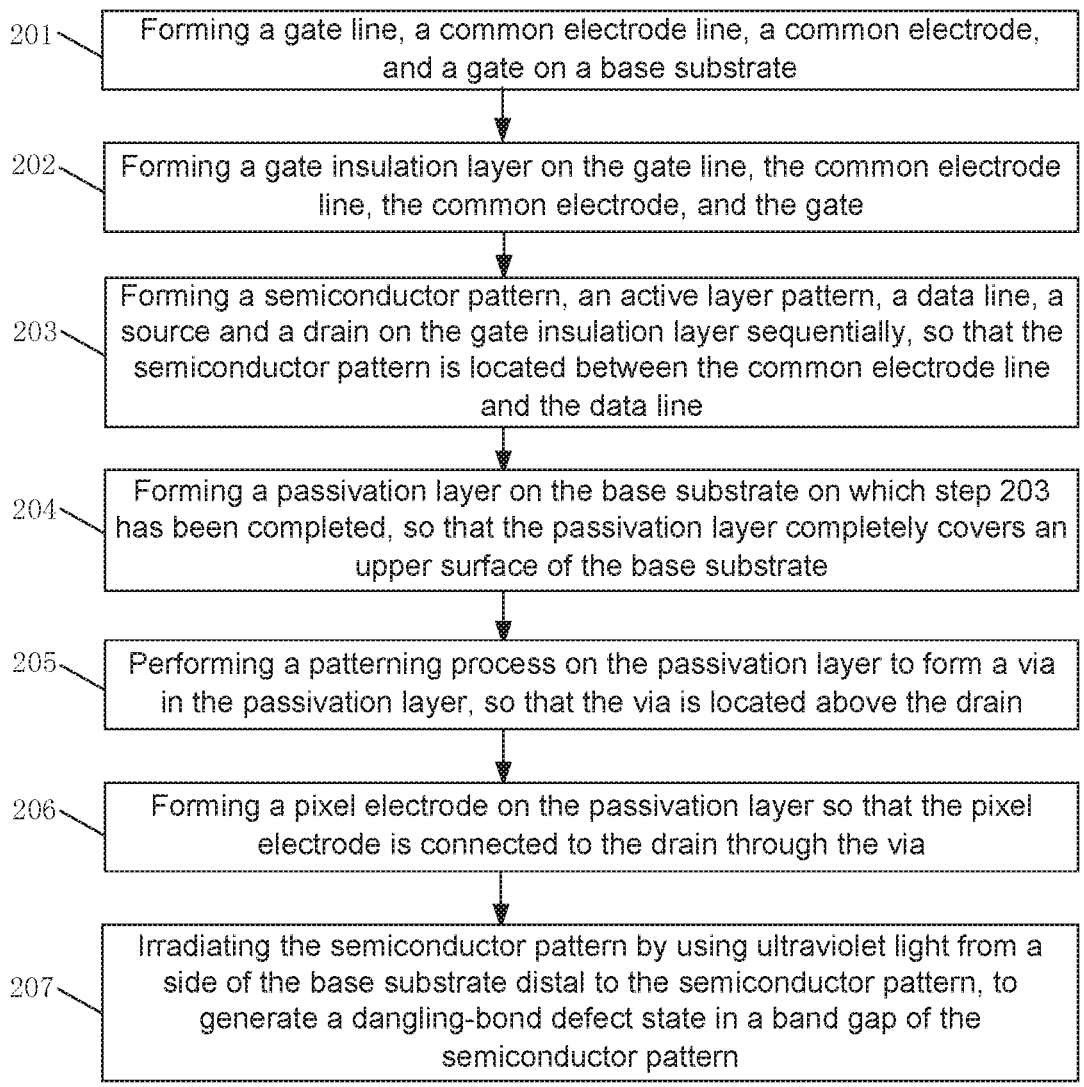
FIG. 2 is a schematic flowchart showing another method for manufacturing a display substrate according to an embodiment of the present disclosure.

FIG. 2 is a schematic flowchart showing another method for manufacturing a display substrate according to an embodiment of the present disclosure. As shown in FIGS. 2 and 3a to 4, the method may include the following steps 201 to 207.

Step 201 includes forming a gate line 2, a common electrode line 3, a common electrode 4, and a gate 5 on a base substrate 1.

Figure 3A:
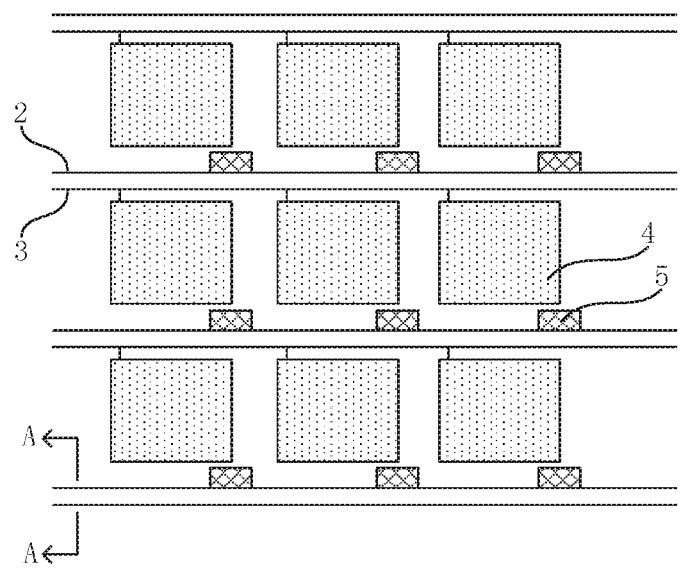
FIG. 3a is a schematic diagram showing a gate line, a common electrode line, a common electrode and a gate in the display substrate formed by the method of FIG. 2.
Figure 3B:
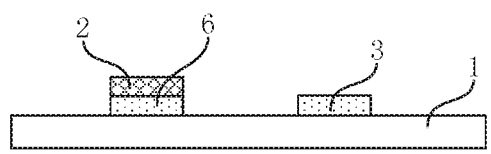
FIG. 3b is a schematic cross-sectional view of the display substrate shown in FIG. 3a taken along the line A-A therein.

FIG. 3a is a schematic diagram showing the gate line 2, the common electrode line 3, the common electrode 4, and the gate 5 of the display substrate formed by the present embodiment, and FIG. 3b is a schematic cross-sectional view of the display substrate shown in FIG. 3a taken along the line A-A therein. As shown in FIGS. 3a and 3b, the gate line 2, the common electrode line 3, the common electrode 4, and the gate 5 are formed on the base substrate 1.

In an embodiment, step 201 may include the following steps 2011 and 2012.

Step 2011 includes forming a common electrode material layer and a gate material layer on the base substrate 1 sequentially, so that the gate material layer is located on the common electrode material layer.

Step 2012 includes performing a patterning process on the gate material layer and the common electrode material layer, to form the gate line 2, the common electrode line 3, the common electrode 4, and the gate 5.

For example, the common electrode line 3 and the common electrode 4 may be provided in a same layer, and a residual common electrode patter 6 is formed below the gate line 2 and the gate 5.

Step 202 includes forming a gate insulation layer 7 on the gate line 2, the common electrode line 3, the common electrode 4, and the gate 5.

Step 203 includes forming a semiconductor pattern 9, an active layer pattern 10, a data line 8, a source 11 and a drain 12 on the gate insulation layer 7 sequentially, so that the semiconductor pattern 9 is located between the common electrode line 3 and the data line 8. It should be noted that, for ease of illustration, FIG. 6 shows the common electrode line 3 only on the right side thereof. However, in a practical application, the common electrode line 3 may extend under the data line 8 on the left side of FIG. 6.

Figure 3E:
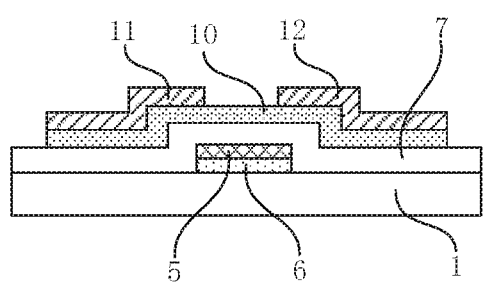
FIG. 3e is a schematic diagram showing a thin film transistor in the display substrate shown in FIG. 3c.

FIG. 3c is a schematic diagram showing a display substrate manufactured by a method according to some embodiments of the present disclosure, FIG. 3d is a schematic cross-sectional view of the display substrate shown in FIG. 3c taken along the line B-B therein, and FIG. 3e is a schematic diagram showing a thin film transistor in the display substrate according to the embodiments of the present disclosure. As shown in FIGS. 3c, 3d and 3e, the semiconductor patter 9, the active layer pattern 10, the data line 8, the source 11 and the drain 12 are formed on the gate insulation layer 7, and the data line 8 may be located on the semiconductor pattern 9.

In an embodiment, step 203 may include the following steps 2031 and 2032.

Step 2031 includes forming a semiconductor material layer and a source-drain material layer on the gate insulation layer 7 sequentially.

In an embodiment, a material of the semiconductor material layer is hydrogenated amorphous silicon (a-Si:H).

Step 2032 includes performing a patterning process on the semiconductor material layer and the source-drain material layer, to form the semiconductor patter 9, the active layer pattern 10, the data line 8, the source 11 and the drain 12.

As described above, the semiconductor patter 9 and the active layer pattern 10 may be provided in a same layer, and the semiconductor pattern 9 and the active layer pattern 10 may be made of the semiconductor material layer. The data line 8, the source 11 and the drain 12 may be provided in a same layer, and the source 11 and the drain 12 may be made of the source-drain material layer. As shown in FIGS. 3a, 3c, and 3e, the thin film transistor T includes the gate 5, the active layer pattern 10, the source 11 and the drain 12, and the active layer pattern 10 is located above the gate 5.

In an embodiment, both the semiconductor pattern 9 and the active layer patter 10 are made of hydrogenated amorphous silicon.

Figure 7:
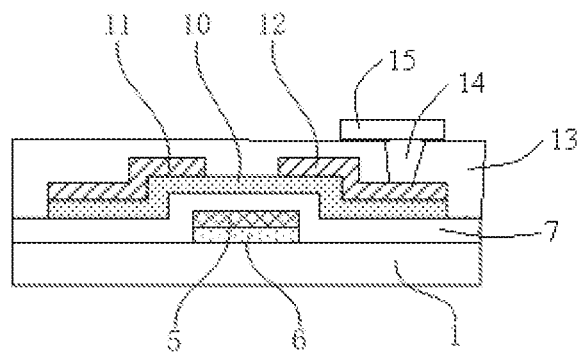
FIG. 7 is a schematic diagram showing the thin film transistor T in the display substrate shown in FIG. 3c and components formed thereon.

Step 204 includes forming a passivation layer 13 on the base substrate 1 on which step 203 has been completed, so that the passivation layer 13 covers the entire upper surface of the base substrate 1, as shown in FIG. 7.

Since the passivation layer 13 covers the entire upper surface of the base substrate 1, the passivation layer 13 is located above the active layer pattern 10, the data line 8, the source 11 and the drain 12.

Step 205 includes performing a patterning process on the passivation layer 13 to form a via 14 in the passivation layer 13, so that the via 14 is located above the drain 12.

Step 206 includes forming a pixel electrode 15 on the passivation layer 13 so that the pixel electrode 15 is electrically connected to the drain 12 through the via 14.

In an embodiment, a material of the pixel electrode 15 may be indium tin oxide (ITO), and a portion of the material of the pixel electrode 15 may be filled in the via 14 to achieve electrical connection of the pixel electrode 15 with the drain 12.

Step 207 includes irradiating the semiconductor pattern 9 by using ultraviolet light from a side of the base substrate 1 distal to the semiconductor pattern 9, to generate a dangling-bond defect state in a band gap of the semiconductor pattern 9.

FIG. 4 is a schematic diagram showing an ultraviolet light irradiation step in the present embodiment. As shown in FIG. 4, the semiconductor pattern 9 is irradiated by using ultraviolet light UV from the side of the base substrate 1 distal to the semiconductor pattern 9. In other words, the semiconductor pattern 9 is irradiated by using ultraviolet light UV from the side of the base substrate 1 distal to the data line 8.

In an embodiment, the semiconductor pattern 9 is irradiated by using ultraviolet light UV with a predetermined exposure dose.

In the present embodiment, the semiconductor pattern 9 is provided under the data line 8, and the semiconductor pattern 9 may be made of hydrogenated amorphous silicon. When being irradiated by using the ultraviolet light UV, the semiconductor pattern 9 will undergo a light-induced degradation effect (which is known as Staebler-Wronski effect, simply referred to as S-W effect or SWE). The irradiation causes a dangling-bond defect state in a band gap of the semiconductor pattern 9. The dangling-bond defect state in the amorphous silicon can trap carriers and thus reduce a density and a lifetime of the carriers, which decreases a dipole moment that causes electron polarization, thereby reducing the dielectric constant E of the semiconductor pattern 9. Since a coupling capacitance is formed between the common electrode line 3 and the data line 8 which have the semiconductor pattern 9 provided therebetween, the coupling capacitance reduces as the dielectric constant c of the semiconductor pattern 9 is decreased, according to a formula C=cS/d of the coupling capacitance, where C denotes the coupling capacitance, S denotes an area by which the common electrode line 3 and the data line 8 overlap with each other in the stacking direction, and d denotes a distance between the common electrode line 3 and the data line 8. Since the semiconductor pattern 9 is located below the data line 8, i.e., since the semiconductor pattern 9 is located between the data line 8 and the common electrode line 3, the semiconductor pattern 9 serves as a dielectric layer located between the data line 8 and the common electrode line 3. When the semiconductor pattern 9 is irradiated by using the ultraviolet light, the dielectric constant c of the semiconductor pattern 9 is decreased, resulting in a decrease in the coupling capacitance. The decrease in the coupling capacitance causes an amplitude (ΔV) and a recovery time (ΔT) of a distortion of a common voltage on the common electrode line to be reduced, thereby reducing the coupled oscillation. In an embodiment, an exposure dose of the ultraviolet light UV may be set in a range from about 3,000 millijoules to about 10,000 millijoules, to achieve a reduction in the coupled oscillation. In another embodiment, the exposure dose of the ultraviolet light UV may be set in a range from 5,000 millijoules to about 7,000 millijoules, to achieve a larger reduction in the coupled oscillation.

In the present embodiment, in a case of being applied to a liquid crystal display device, the display substrate manufactured by the method causes the coupled oscillation thereof to be reduced, thereby effectively reducing a line residual image of the liquid crystal display device.

In the present embodiment, in a case of being applied to an OLED display device, the display substrate manufactured by the method causes the coupled oscillation thereof to be reduced, thereby effectively reducing the crosstalk of the OLED display device.

As shown in FIGS. 3e and 4, when the semiconductor patter 9 is irradiated by using the ultraviolet light UV from the side of the base substrate 1 distal to the data line 8, the active layer patter 10 is prevented from being irradiated by the ultraviolet light UV due to the blocking of the gate 5.

In the present embodiment, the semiconductor pattern 9 and the active layer pattern 10 provided in a same layer may be irradiated by using an ultraviolet light curing device during a manufacturing process of the display substrate. That is, the ultraviolet irradiation process may be completed prior to an assembling process in which a liquid crystal layer is encapsulated into a cell, thereby avoiding the risk of deterioration of the liquid crystal. In this method, the ultraviolet light irradiation process is simple, no additional equipment is required, and the cost for implementing the method is low.

In the method for manufacturing a display substrate according to the present embodiment, the common electrode line, the semiconductor pattern and the data line are formed on the base substrate, so that the semiconductor patter is provided between the common electrode line and the data line. Further, the semiconductor pattern is irradiated by using the light in the predetermined wavelength range from the side of the base substrate distal to the semiconductor pattern, to generate a dangling-bond defect state in a band gap of the semiconductor pattern. Thus, an amplitude and a recovery time of a distortion of a common voltage on the common electrode line are reduced, thereby reducing the coupled oscillation.

Figure 5:
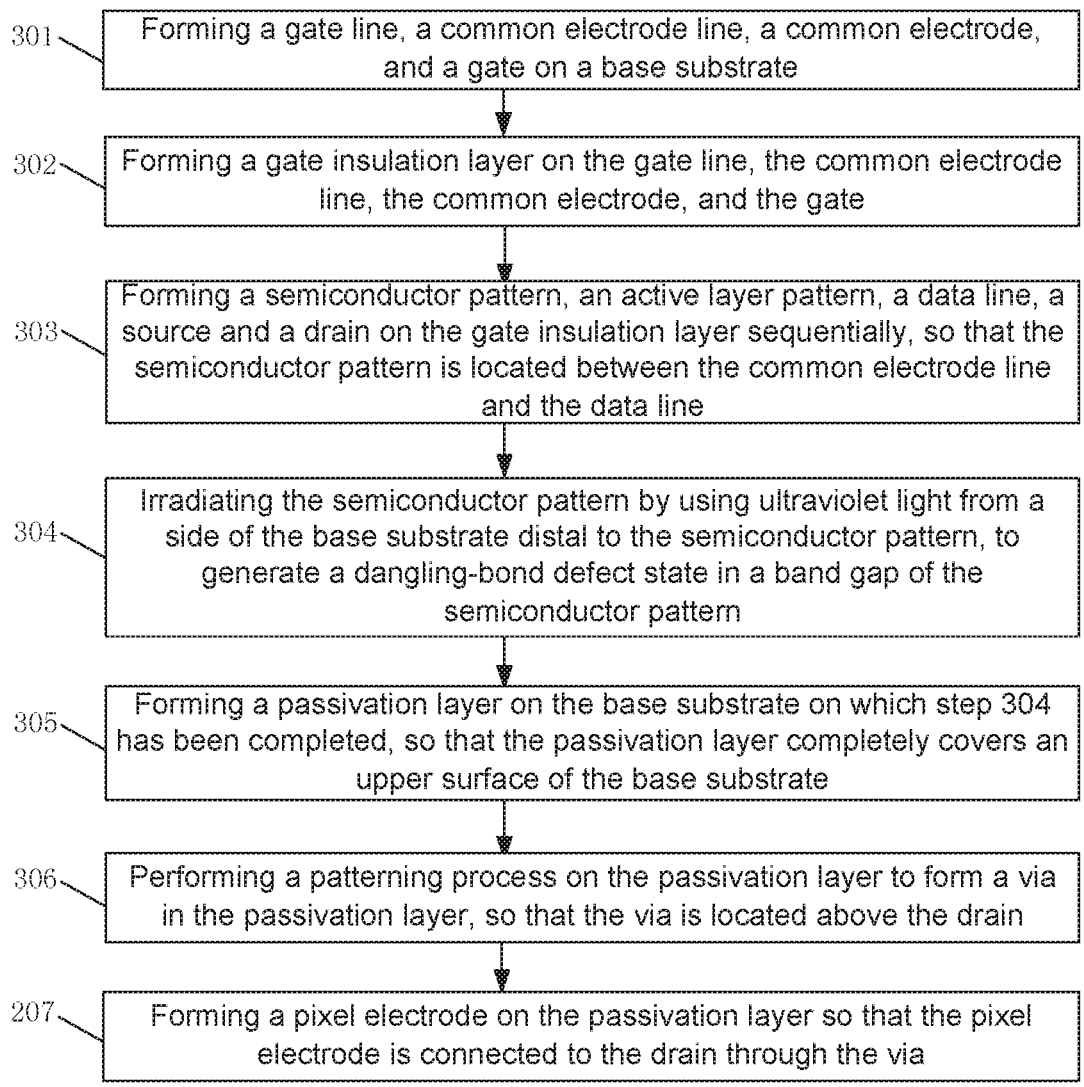
FIG. 5 is a schematic flowchart showing still another method for manufacturing a display substrate according to an embodiment of the present disclosure.

FIG. 5 is a schematic flowchart showing still another method for manufacturing a display substrate according to an embodiment of the present disclosure. As shown in FIG. 5, the method may include the following steps 301 to 307.

Step 301 includes forming a gate line 2, a common electrode line 3, a common electrode 4, and a gate 5 on a base substrate 1.

Detailed description of step 301 may be referred to that of step 201 in the embodiment corresponding to FIG. 2, and is omitted here to avoid redundant description.

Step 302 includes forming a gate insulation layer 7 on the gate line 2, the common electrode line 3, the common electrode 4, and the gate 5.

Step 303 includes forming a semiconductor pattern 9, an active layer pattern 10, a data line 8, a source 11 and a drain 12 on the gate insulation layer 7 sequentially, so that the semiconductor pattern 9 is located between the common electrode line 3 and the data line 8.

Detailed description of step 303 may be referred to that of step 203 in the embodiment corresponding to FIG. 2, and is omitted here to avoid redundant description.

Step 304 includes irradiating the semiconductor pattern 9 by using ultraviolet light from a side of the base substrate 1 distal to the semiconductor pattern 9, to generate a dangling-bond defect state in a band gap of the semiconductor pattern 9.

Detailed description of step 304 may be referred to that of step 207 in the embodiment corresponding to FIG. 2, and is omitted here to avoid redundant description.

Step 305 includes forming a passivation layer 13 on the base substrate 1 on which step 304 has been completed, so that the passivation layer 13 covers the entire upper surface of the base substrate 1.

Since the passivation layer 13 covers the entire upper surface of the base substrate 1, the passivation layer 13 is located above the active layer pattern 10, the data line 8, the source 11 and the drain 12.

Step 306 includes performing a patterning process on the passivation layer 13 to form a via 14 in the passivation layer 13, so that the via 14 is located above the drain 12.

Step 307 includes forming a pixel electrode 15 on the passivation layer 13 so that the pixel electrode 15 is electrically connected to the drain 12 through the via 14.

In an embodiment, a material of the pixel electrode 15 may be indium tin oxide (ITO), and a portion of the material of the pixel electrode 15 may be filled in the via 14 to achieve electrical connection of the pixel electrode 15 with the drain 12.

In the method for manufacturing a display substrate according to the present embodiment, the common electrode line, the semiconductor pattern and the data line are formed on the base substrate, so that the semiconductor pattern is provided between the common electrode line and the data line. Further, the semiconductor pattern is irradiated by using the light in the predetermined wavelength range from the side of the base substrate distal to the semiconductor pattern, to generate a dangling-bond defect state in a band gap of the semiconductor pattern. Thus, an amplitude and a recovery time of a distortion of a common voltage on the common electrode line are reduced, thereby reducing the coupled oscillation.

An embodiment of the present disclosure provides a display substrate, which is manufactured by the method according to the embodiment corresponding to any one of FIGS. 1, 2 and 5.

In the present embodiment, the display substrate may include an array substrate or an OLED display substrate.

In the display substrate according to the present embodiment, the common electrode line, the semiconductor pattern and the data line are formed on the base substrate, so that the semiconductor pattern is provided between the common electrode line and the data line. Further, the semiconductor patter is irradiated by using the light in the predetermined wavelength range from the side of the base substrate distal to the semiconductor pattern, to generate a dangling-bond defect state in a band gap of the semiconductor patter. Thus, an amplitude and a recovery time of a distortion of a common voltage on the common electrode line are reduced, thereby reducing the coupled oscillation.

An embodiment of the present disclosure provides a display device, which includes the display substrate provided by the foregoing embodiment.

In the present embodiment, the display device may include a liquid crystal display device, of which a display substrate may be the array substrate. Alternatively, the display device may include an OLED display device, of which a display substrate may be the OLED display substrate. It should be noted that, in a case where the display substrate is the OLED display substrate, the common electrode line 3 and the data line 8 may correspond to an anode and a cathode of the OLED display substrate, respectively, and the semiconductor pattern 9 may be provided between the anode and the cathode.

In the display device according to the present embodiment, the common electrode line, the semiconductor pattern and the data line are formed on the base substrate, so that the semiconductor pattern is provided between the common electrode line and the data line. Further, the semiconductor pattern is irradiated by using the light in the predetermined wavelength range from the side of the base substrate distal to the semiconductor pattern, to generate a dangling-bond defect state in a band gap of the semiconductor pattern. Thus, an amplitude and a recovery time of a distortion of a common voltage on the common electrode line are reduced, thereby reducing the coupled oscillation.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A method for manufacturing a display substrate, comprising steps of
    forming a common electrode line, a semiconductor pattern, and a data line on a base substrate, so that the semiconductor pattern is located between the common electrode line and the data line; and
    irradiating the semiconductor pattern by using light in a predetermined wavelength range from a side of the base substrate distal to the semiconductor pattern, to generate a dangling-bond defect state in a band gap of the semiconductor pattern.

2. The method according to claim 1, wherein the light in the predetermined wavelength range is ultraviolet light; and
    the step of irradiating the semiconductor pattern by using light in a predetermined wavelength range comprises a step of irradiating the semiconductor pattern by using ultraviolet light with a predetermined exposure dose.

3. The method according to claim 2, wherein the predetermined exposure dose ranges from 3,000 millijoules to 10,000 millijoules.

4. The method according to claim 3, wherein the predetermined exposure dose ranges from 5,000 millijoules to 7,000 millijoules.

5. The method according to claim 4, wherein the semiconductor pattern is made of hydrogenated amorphous silicon.

6. The method according to claim 3, wherein the semiconductor pattern is made of hydrogenated amorphous silicon.

7. The method according to claim 2, wherein the semiconductor pattern is made of hydrogenated amorphous silicon.

8. The method according to claim 1, wherein the step of forming a common electrode line, a semiconductor pattern, and a data line on a base substrate comprises steps of
    forming a gate line on the base substrate;
    forming a gate insulation layer on the gate line; and
    forming the semiconductor pattern and the data line on the gate insulation layer sequentially.

9. The method according to claim 8, wherein the step of forming a gate line on the base substrate comprises forming a common electrode and a gate, so that the gate line and the gate are located in a same layer, and the common electrode and the common electrode line are located in a same layer; and
    the step of forming the semiconductor pattern and the data line on the gate insulation layer sequentially comprises forming an active layer pattern, a source and a drain, so that the semiconductor pattern and the active layer pattern are located in a same layer, the source, the drain and the data line are located in a same layer, and the data line and the semiconductor pattern are arranged adjacent to each other.

10. The method according to claim 9, wherein prior to the step of irradiating the semiconductor pattern by using light in a predetermined wavelength range from a side of the base substrate distal to the semiconductor pattern, the method further comprises steps of
    forming a passivation layer above the base substrate, so that the passivation layer completely covers an upper surface of the base substrate;
    forming a via in the passivation layer; and
    forming a pixel electrode on the passivation layer, so that the pixel electrode is connected to the drain through the via.

11. The method according to claim 10, wherein the semiconductor pattern is made of hydrogenated amorphous silicon.

12. The method according to claim 9, wherein after the step of irradiating the semiconductor pattern by using light in a predetermined wavelength range from a side of the base substrate distal to the semiconductor pattern, the method further comprises steps of
    forming a passivation layer above the base substrate, so that the passivation layer completely covers an upper surface of the base substrate;
    forming a via in the passivation layer; and
    forming a pixel electrode on the passivation layer, so that the pixel electrode is connected to the drain through the via.

13. The method according to claim 12, wherein the semiconductor pattern is made of hydrogenated amorphous silicon.

14. The method according to claim 6, wherein the semiconductor pattern is made of hydrogenated amorphous silicon.

15. The method according to claim 8, wherein the semiconductor pattern is made of hydrogenated amorphous silicon.

16. The method according to claim 1, wherein the semiconductor pattern is made of hydrogenated amorphous silicon.

17. The method according to claim 1, wherein there is an overlapping region between the data line and the common electrode line in a direction perpendicular to the base substrate, and at the overlapping region, the semiconductor pattern is formed between the common electrode line and the data line.

* * * * *